(12) United States Patent
Zhang et al.

(10) Patent No.: US 8,164,167 B2
(45) Date of Patent: Apr. 24, 2012

(54) INTEGRATED CIRCUIT STRUCTURE AND A METHOD OF FORMING THE SAME

(75) Inventors: Yue Ping Zhang, Singapore (SG); Mei Sun, Singapore (SG)

(73) Assignee: Nanyang Technological University, Singapore (SG)

( * ) Notice: Subject to any disclaimer, the term of this patent is extended or adjusted under 35 U.S.C. 154(b) by 105 days.

(21) Appl. No.: 12/529,241

(22) PCT Filed: Feb. 29, 2008

(86) PCT No.: PCT/SG2008/000069
§ 371 (c)(1),
(2), (4) Date: Aug. 31, 2009

(87) PCT Pub. No.: WO2008/111914
PCT Pub. Date: Sep. 18, 2008

(65) Prior Publication Data
US 2010/0219513 A1    Sep. 2, 2010

Related U.S. Application Data

(60) Provisional application No. 60/893,963, filed on Mar. 9, 2007.

(51) Int. Cl.
*H01L 23/552* (2006.01)
(52) U.S. Cl. ............... 257/659; 257/232; 257/E21.499; 257/E21.114; 438/121
(58) Field of Classification Search .................. 257/659, 257/E23.114, E21.499, 232; 438/121
See application file for complete search history.

(56) References Cited

U.S. PATENT DOCUMENTS

| 4,761,654 | A | 8/1988 | Zaghloul |
| 6,201,454 | B1 | 3/2001 | Kinayman et al. |
| 6,236,366 | B1 | 5/2001 | Yamamoto et al. |
| 6,759,742 | B2 | 7/2004 | Budka |
| 2006/0033664 | A1* | 2/2006 | Soler Castany et al. ............ 343/700 MS |
| 2006/0256018 | A1 | 11/2006 | Soler Castany et al. |
| 2006/0285480 | A1 | 12/2006 | Janofsky |
| 2007/0164907 | A1 | 7/2007 | Gaucher et al. |
| 2008/0029886 | A1* | 2/2008 | Cotte et al. .................... 257/728 |

FOREIGN PATENT DOCUMENTS

EP    1085597 A2    3/2001
(Continued)

OTHER PUBLICATIONS

Budka, Thomas P., "Wide-Bandwidth Millimeter-Wave Bond-Wire Interconnects," IEEE Transactions on Microwave Theory and Techniques, Apr. 2001, pp. 715-718, vol. 49, No. 4.

(Continued)

*Primary Examiner* — Thomas L Dickey
*Assistant Examiner* — Fazli Erdem
(74) *Attorney, Agent, or Firm* — Alston & Bird LLP

(57) ABSTRACT

An integrated circuit structure is disclosed. The integrated circuit structure includes a first package substrate including a radiating element, the radiating element having a radiating element connection extending from the radiating element. The integrated circuit structure further includes a first chip positioned adjacent to the radiating element connection, the first chip having a first chip connection on a surface of the first chip, wherein the first chip connection forms a capacitive coupling with the radiating element connection. A method of forming an integrated circuit structure is also disclosed.

20 Claims, 11 Drawing Sheets

FOREIGN PATENT DOCUMENTS

| | | |
|---|---|---|
| EP | 0762533 B1 | 11/2004 |
| WO | WO 02/060004 A2 | 8/2002 |
| WO | WO 2004/042868 A1 | 5/2004 |
| WO | WO 2006/008180 A1 | 1/2006 |
| WO | WO 2006/009934 A1 | 1/2006 |
| WO | WO 2007/089106 A1 | 8/2007 |

OTHER PUBLICATIONS

Desclos, Laurent, "V-Band Double-Slot Antenna Integration on LTCC Substrate Using Thick-Film Technology," Microwave and Optical Technology Letters, Mar. 5, 2001, pp. 354-357, vol. 28, No. 5.

Industry Alliance, "Antenna-in-Package in LTCC Paper Wins Top Prize in IEEE International Workshop," Cutting Edge, Jan. 2008, p. 5.

Lee, Jong-Hoon, et al., "Highly Integrated Millimeter-Wave Passive Components Using 3-D LTTCC System-on-Package (SOP) Technology," IEEE Transactions on Microwave Theory and Techniques, Jun. 2005, pp. 2220-2229, vol. 53, No. 6.

Oh, Young-Chul, et al., "Small Wideband RFID Tag Antenna Mountable on Metallic Surfaces," Proceedings of ISAP2007, Niigata, Japan, pp. 632-635.

Sun, Yaoming, et al., "An Integrated 60 GHz Transceiver Front-End for OFDM in SiGe: BiCMOS," Wireless Wold Research Forum, Apr. 16, 2006, pp. 1-6.

Ying, Chen, et al., "A Planar Antenna in LTCC for Single-Package Ultrawide-Band Radio," IEEE Transactions on Antennas and Propagation, Sep. 2005, pp. 3089-3093, vol. 53, No. 9.

Ying, Chen, et al., "An LTCC Planar Ultra-Wideband Antenna," Microwave and Optical Technology Letters, Aug. 5, 2004, pp. 220-222, vol. 42, No. 3.

Zhang, Y.P., "Antenna-in-Package Technology for Modern Radio Systems," 2006 IEEE International Workshop on Antenna Technology Small Antennas and Novel Metamaterials, 2006, pp. 37-40.

Zhang, Y.P., "Integration of Microstrip Antenna on Cavity-Down Ceramic Ball Grid Array Package," Electronics Letters, Oct. 24, 2002, pp. 1307-1308, vol. 38, No. 22.

* cited by examiner

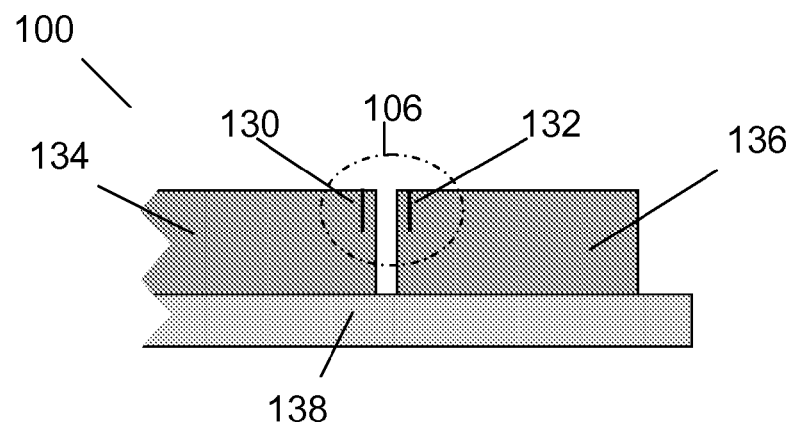
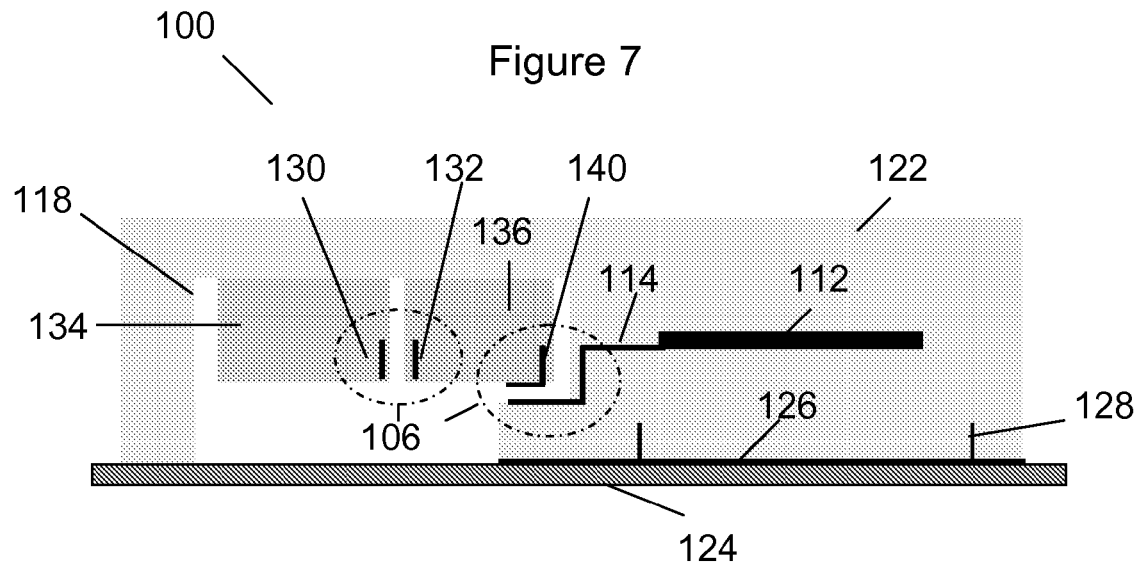

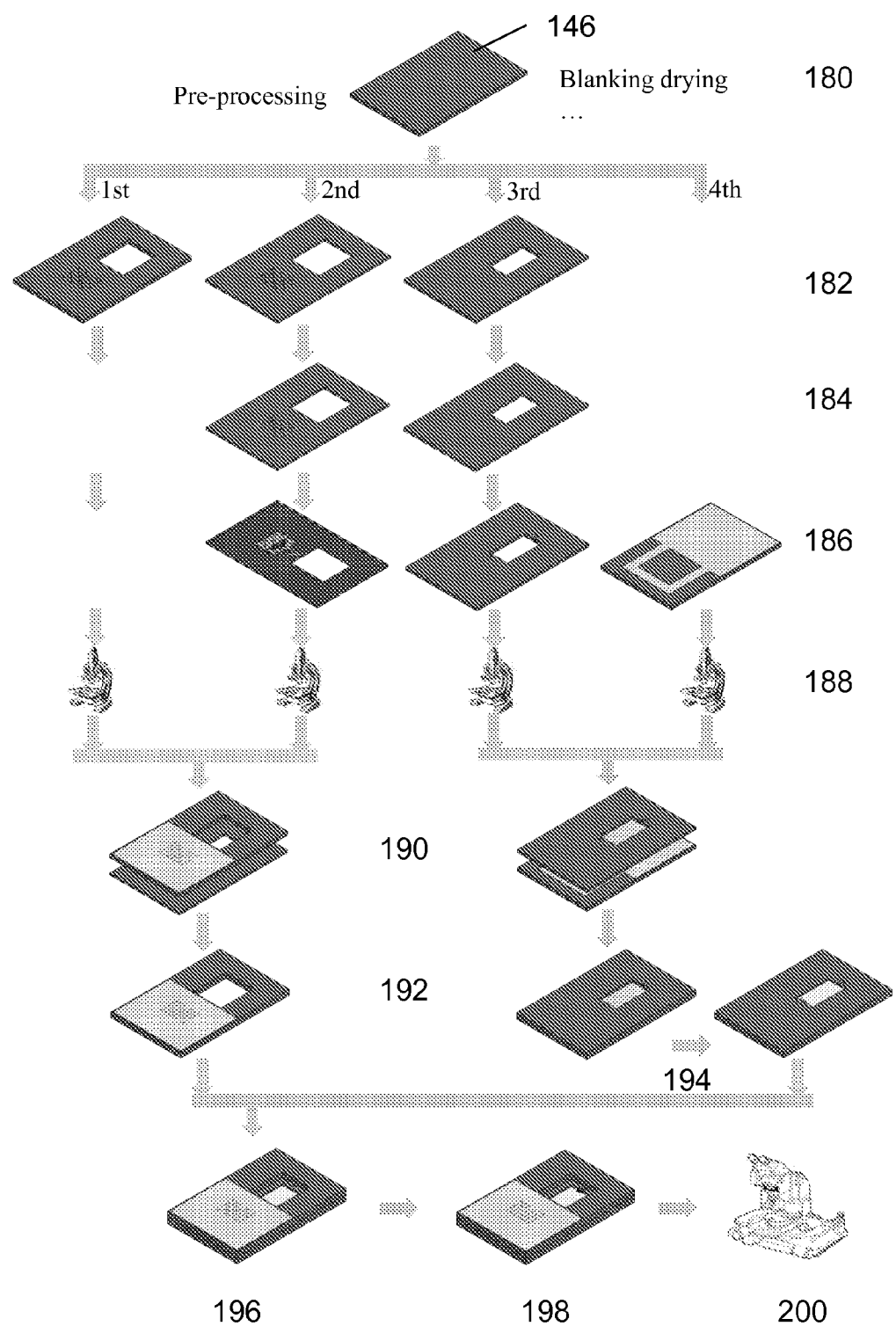

INTEGRATED CIRCUIT STRUCTURE AND A METHOD OF FORMING THE SAME

This application is the National Stage of International Application No. PCT/SG2008/000069, filed on Feb. 29, 2008, which claims the benefit of U.S. provisional application 60/893,963 (filed on 9 Mar. 2007), the entire contents of which are incorporated herein by reference for all purposes.

FIELD OF THE INVENTION

Embodiments of the invention relate generally to integrated circuit structures and a method of forming the same. Specifically, embodiments of the invention relate to an integrated circuit package antenna (ICPA) and an antenna-in-package (AiP).

BACKGROUND OF THE INVENTION

Traditionally, millimeter-wave (MMW), sub-millimeter-wave (sub-MMW), and Terahertz radios are implemented with multiple chips fabricated in III-V semiconductor technologies. As devices used can generate larger output power, the requirement for the transmission loss from the radio frequency (RF) output to the antenna input is relaxed. When a radio having a transmitter (Tx) and receiver (Rx) uses multi-chip module technology, the MMW antenna may be connected to the Tx or Rx RF output by a combination of bonding wires and wire lines, or by a combination of flip chip connection and wire line. The wire line is necessary because the multi-chip module solution of the Tx or Rx does not allow for the Tx or Rx module to approach the antenna closely.

Driven by demand for low cost and small-sized MMW radio, the system-on-chip (SoC) or system-in-package (SiP) solutions of MMW radios have been proposed. An example of a SoC MMW radio in Silicon-Germanium (SiGe) or complementary metal oxide semiconductor (CMOS) involves a MMW antenna being fabricated on the substrate. The antenna is then connected to the Tx or Rx chip by bonding wires. Another example involves a MMW antenna sitting on an antenna socket. The socket may be made of a low-loss dielectric material or a hollow metal filled with foam or air. The antenna is then connected to Tx or Rx chip by flip chip technology.

The feeding from RF output to the antenna usually involves contact coupling or in particular inductive feeding due to inherent stray inductances in wire lines, bond wires and flip chip connection for example. MMW AiP designs using this inductive feeding may meet great challenges in impedance matching and reduction of transmission loss. This is because the reactance due to (stray) inductance increases proportionately with frequency. It may be difficult to achieve wide impedance matching bandwidth using this inductive feeding. For example, the bond wire feeding at 60 GHz is extremely difficult to be realized in MMW AiP designs.

Several attempts have been made to address these problems due to the stray inductance so as to enable realization of MMW AiP design. One possible approach to solve this problem may involve contactless coupling or alternating current coupling. Contactless coupling may involve capacitive coupling or inductive coupling for example.

One such attempt involves a microstrip antenna array having a broadband linear polarization, and circular polarization with high polarization purity. The feedlines of the array are capacitively coupled to feeding patches at a single feedpoint or at multiple feedpoints, the feeding patches in turn being electromagnetically coupled to corresponding radiating patches.

Another such attempt involves a microstrip antenna in low temperature co-fired ceramic (LTCC). The antenna is excited by proximity-coupling or capacitive coupling and has a total thickness of 12 metal layers and 11 substrate layers. The use of proximity-coupling allows for different polarization reception of signals that exhibits improved cross-channel isolation in comparison to a traditional coplanar microstrip feed. There are two substrate layers separating the patch and the feedline, and two substrate layers separating the feedline and the ground layer. The remaining seven substrate layers are used for burying RF circuitry beneath the antenna that includes the filter, integrated passives, and other components.

However, there is still a need for an alternative antenna-in-package design which advantageously avoids or reduces some of the above-mentioned drawbacks of prior art devices.

SUMMARY OF THE INVENTION

Various embodiments of the invention provide an integrated circuit structure and a method of forming the same.

An embodiment of the invention provides an integrated circuit structure. The integrated circuit structure includes a first package substrate comprising a radiating element, the radiating element having a radiating element connection extending from the radiating element; a first chip positioned adjacent to the radiating element connection, the first chip having a first chip connection on a surface of the first chip; wherein the first chip connection forms a capacitive coupling with the radiating element connection.

Another embodiment of the invention provides an integrated circuit structure. The integrated circuit structure includes a first package substrate comprising an electronic component, the electronic component having a electronic component connection extending from the electronic component; a first chip positioned adjacent to the electronic component connection, the first chip having a first chip connection on a surface of the first chip; wherein the first chip connection forms a capacitive coupling with the electronic component connection.

A further embodiment of the invention provides an integrated circuit structure. The integrated circuit structure includes a first package substrate comprising a radiating element, the radiating element having a radiating element connection extending from the radiating element; a first chip positioned adjacent to the radiating element connection, the first chip having a first chip connection on a surface of the first chip; wherein the first chip connection forms an inductive coupling with the radiating element connection.

Another embodiment of the invention provides a method of forming an integrated circuit structure. The method includes forming a radiating element on a first package substrate, the radiating element having a radiating element connection extending from the radiating element; positioning a first chip adjacent to the radiating element connection, the first chip having a first chip connection on a surface of the first chip; wherein the first chip connection forms a capacitive coupling with the radiating element connection.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 6 shows a chip to chip connection by a capacitive coupling in an integrated circuit structure according to an embodiment of the present invention;

FIG. 7 shows a combination of a chip to package connection and a chip to chip connection by respective capacitive coupling in an integrated circuit structure according to an embodiment of the present invention;

FIG. 14 shows a fabrication process of an integrated circuit structure according to an embodiment of the present invention;

DETAILED DESCRIPTION OF THE INVENTION

Figure 1:
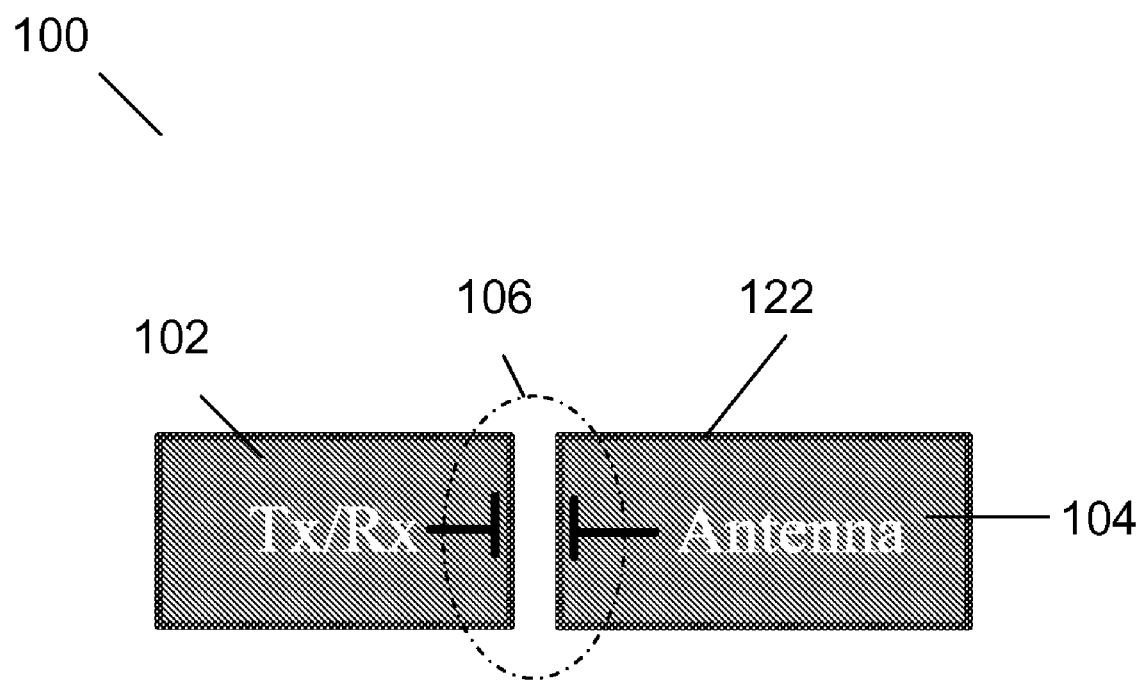
FIG. 1 shows a chip to package connection by a capacitive coupling in an integrated circuit structure according to an embodiment of the present invention.

Exemplary embodiments of an integrated circuit structure and the method of forming the same are described in details below with reference to the accompanying figures. In addition, the exemplary embodiments described below can be modified in various aspects without changing the essence of the invention.

An embodiment of the invention provides an integrated circuit structure. The integrated circuit structure includes a first package substrate comprising a radiating element, the radiating element having a radiating element connection extending from the radiating element; a first chip positioned adjacent to the radiating element connection, the first chip having a first chip connection on a surface of the first chip; wherein the first chip connection forms a capacitive coupling with the radiating element connection. The integrated circuit structure may be termed an integrated circuit package antenna (ICPA) and the first package substrate may be termed an antenna-in-package (AiP). The radiating element may be an antenna. An antenna is a transducer designed to transmit or receive electromagnetic waves. In other words, antennas convert electromagnetic waves into electrical currents and vice versa. Antennas are used in systems such as radio and television broadcasting, point-to-point radio communication, wireless LAN, radar, and space exploration. Physically, an antenna is an arrangement of conductors that generate a radiating electromagnetic field in response to an applied alternating voltage and the associated alternating electric current, or can be placed in an electromagnetic field so that the field will induce an alternating current in the antenna and a voltage between its terminals. Antenna may be used for transmission and reception of radio frequency signals to and from the first chip.

In one embodiment, the first chip may be positioned on or housed within the first package substrate.

In another embodiment, the first package substrate may include a socket for housing the first chip and a cavity positioned below the radiating element for shielding magnetic field from the first chip. The socket may be used for housing one chip or more. The socket and the cavity may be preformed in the first package substrate.

According to an embodiment of the invention, the integrated circuit structure further includes a second package substrate positioned below the first package substrate. The second package substrate may include a package frame or a printed circuit board but not so limited.

In a further embodiment, the integrated circuit structure further includes a ground plane positioned between at least a portion of the first package substrate and at least a portion of the second package substrate. The ground plane is positioned below the radiating element and the first chip such that the ground plane overlaps at least an area covered by the radiating element and a portion of the first chip.

In a further embodiment, the cavity is formed by at least two vias in the first package substrate and a portion of the ground plane.

Accordingly to an embodiment of the invention, the first chip connection may be positioned substantially parallel to the radiating element connection. The first chip connection may be positioned at a distance away from the radiating element connection.

In one embodiment, the first chip connection and the radiating element connection may be positioned substantially parallel to a horizontal plane of the first package substrate. In another embodiment, the first chip connection and the radiating element connection may be positioned substantially perpendicular to a horizontal plane of the first package substrate.

According to an embodiment of the invention, the integrated circuit structure further includes a second chip positioned on or housed within the first package substrate. The second chip may be positioned adjacent to the first chip.

In one embodiment, the second chip may include a second chip connection on a surface of the second chip. The first chip connection may form a capacitive coupling with the second chip connection.

Accordingly to an embodiment of the invention, the first chip may be positioned or housed within a third package substrate. The third package substrate may include a socket for housing the first chip and a cavity positioned over the radiating element for shielding magnetic field from the first chip.

In one embodiment, the first package substrate and the third package substrate may be formed from a packaging material. The packaging material may be selected from a group of packaging materials consisting of low temperature co-fired ceramic (LTCC), liquid crystal polymer (LCP), and silicon.

In a further embodiment, the first chip and the second chip may be integrated circuits.

In a further embodiment, the first chip connection, the second chip connection, and the radiating element connection may include conductive materials. The conductive material may be selected from a group of conductive materials consisting of copper, silver or gold.

In a further embodiment, the first chip is distanced from the radiating element.

Another embodiment of the invention provides an integrated circuit structure. The integrated circuit structure may include a first package substrate comprising an electronic component, the electronic component having a electronic component connection extending from the electronic component; a first chip positioned adjacent to the electronic component connection, the first chip having a first chip connection on a surface of the first chip; wherein the first chip connection forms a capacitive coupling with the electronic component connection.

A further embodiment of the invention provides an integrated circuit structure. The integrated circuit structure includes a first package substrate comprising a radiating element, the radiating element having a radiating element connection extending from the radiating element; a first chip positioned adjacent to the radiating element connection, the first chip having a first chip connection on a surface of the first chip; wherein the first chip connection forms an inductive coupling with the radiating element connection.

Another embodiment of the invention provides a method of forming an integrated circuit structure. The method may include forming a radiating element on a first package substrate, the radiating element having a radiating element connection extending from the radiating element; positioning a first chip adjacent to the radiating element connection, the first chip having a first chip connection on a surface of the first chip; wherein the first chip connection forms a capacitive coupling with the radiating element connection.

In one embodiment, the method may further include positioning the first chip on or within the first package substrate.

In a further embodiment, the method further may include forming a socket in the first package substrate for housing the first chip and forming a cavity in the first package substrate, the cavity being positioned below the radiating element for shielding magnetic field from the first chip.

According to an embodiment of the invention, the method may further include positioning a second package substrate below the first package substrate. The second package substrate includes a package frame or a printed circuit board but not so limited.

In a further embodiment, the method further include positioning a ground plane between at least a portion of the first package substrate and at least a portion of the second package substrate. The method may include positioning the ground plane below the radiating element and the first chip such that the ground plane overlaps at least an area covered by the radiating element and a portion of the first chip.

In another embodiment, the cavity may be formed by at least two vias in the first package substrate and a portion of the ground plane.

According to one embodiment, the method may further include positioning the first chip connection substantially parallel to the radiating element connection. The method may include positioning the first chip connection at a distance away from the radiating element connection.

In one embodiment, the method may further include positioning the first chip connection and the radiating element connection substantially parallel to a horizontal plane of the first package substrate. In another embodiment, the method further includes positioning the first chip connection and the radiating element connection substantially perpendicular to a horizontal plane of the first package substrate.

According to one embodiment of the invention, the method may further include positioning a second chip on or within the first package substrate. The method may include positioning the second chip adjacent to the first chip.

In one embodiment, the second chip may include a second chip connection on a surface of the second chip. The first chip connection may form a capacitive coupling with the second chip connection.

Accordingly to one embodiment of the invention, the method may further include positioning the first chip in or within a third package substrate. The method may further include forming a socket in the third package substrate for housing the first chip and forming a cavity in the third package substrate, the cavity being positioned over the radiating element for shielding magnetic field from the first chip.

In one embodiment, the first package substrate and the third package substrate may be formed from a packaging material. The packaging may be selected from a group of packaging materials consisting of low temperature co-fired ceramic, liquid crystal polymer, and silicon.

In a further embodiment, the first chip and the second chip may be integrated circuits. The radiating element may be an antenna.

In a further embodiment, the first chip connection, the second chip connection and the radiating element connection may include conductive materials. The conductive material may be selected from a group of conductive materials consisting of copper, silver or gold FIG. 1 shows a chip to package connection by a capacitive coupling in an integrated circuit structure 100 according to an embodiment of the present invention; FIG. 1 shows an integrated circuit structure 100 including a chip 102 and an antenna in a package 104 or an antenna-in-package (AiP). The chip 102 may include a transmitter and a receiver. The alternating current coupling feeding or a capacitive coupling feeding 106 is formed with one part of the capacitor on the chip 102 and the other part of the capacitor on the package 122 of the antenna-in-package 104.

Figure 2:
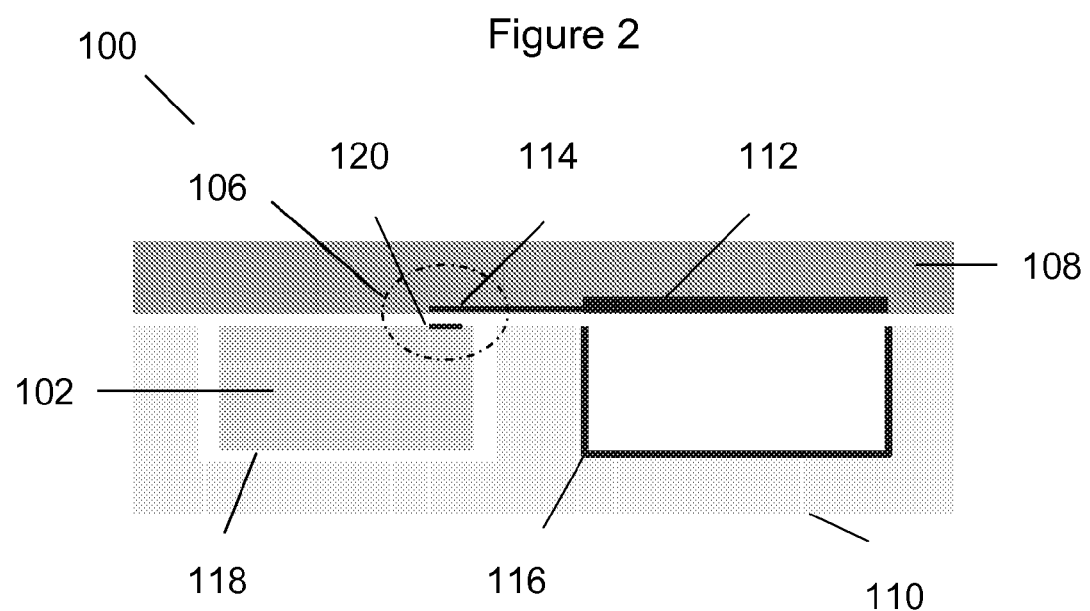
FIG. 2 shows a chip to package connection by a capacitive coupling in an integrated circuit structure with the chip and the antenna-in-package on separate package substrates according to an embodiment of the present invention.

FIG. 2 shows a chip to package connection by a capacitive coupling in an integrated circuit structure 100 with the chip and the antenna-in-package on separate package substrates according to an embodiment of the present invention. FIG. 2 shows an integrated circuit structure 100 including a first package substrate 108 and a second package substrate 110 arranged adjacent the first package substrate 108. The first package substrate 108 and the second package substrate 110 may include a package material. The package material may include low temperature co-fired ceramic (LTCC), Flame Retardant 4 (FR4), liquid crystal polymer, silicon, but not so limited.

An antenna 112 is disposed on a surface of the first package substrate 108 and a feedline 114 extends from one end of the antenna 112 along one surface of the first package substrate 108. The antenna 112 may also be formed within the first package substrate 108. The antenna 112 and the feedline 114 may include conductive materials, for example copper, silver or gold. The antenna 112 and the feedline 114 may also be of the same conductive material.

A cavity 116 is formed in the second package substrate 110 and is positioned below the antenna 112 in the first package substrate 108. The cavity formed has two purposes. The first purpose is to improve the antenna performance such as to broaden the antenna 112 impedance bandwidth and to enhance the antenna 112 gain. The other purpose is to reduce the potential electromagnetic interference from the antenna 112 radiation to the chip 102. The cavity 116 is lined with a plating material and the planar area occupied by the cavity 116 is at least comparable or larger than the planar area of the antenna 112 so as to confine the magnetic field within the cavity 116 and thereby shield the magnetic field from the chip 102. A socket 118 is also formed in the second package substrate 110, adjacent to the cavity 116. The socket 118 is configured to house a chip 102 but not so limited.

The chip 102 includes a chip connection 120 formed on a surface of the chip 102. The chip connection 120 may be formed of a conductive material, similar to that of the feedline 114 or the antenna 112 but not so limited. The chip connection 120 is arranged substantially parallel to the feedline 114 and the chip connection 120 and the feedline 114 are positioned substantially parallel to a horizontal plane of the first package substrate 108 or of the second package substrate 110. The chip connection 120 forms a capacitor 106 with the feedline 114 extending from the antenna 112.

Figure 3:
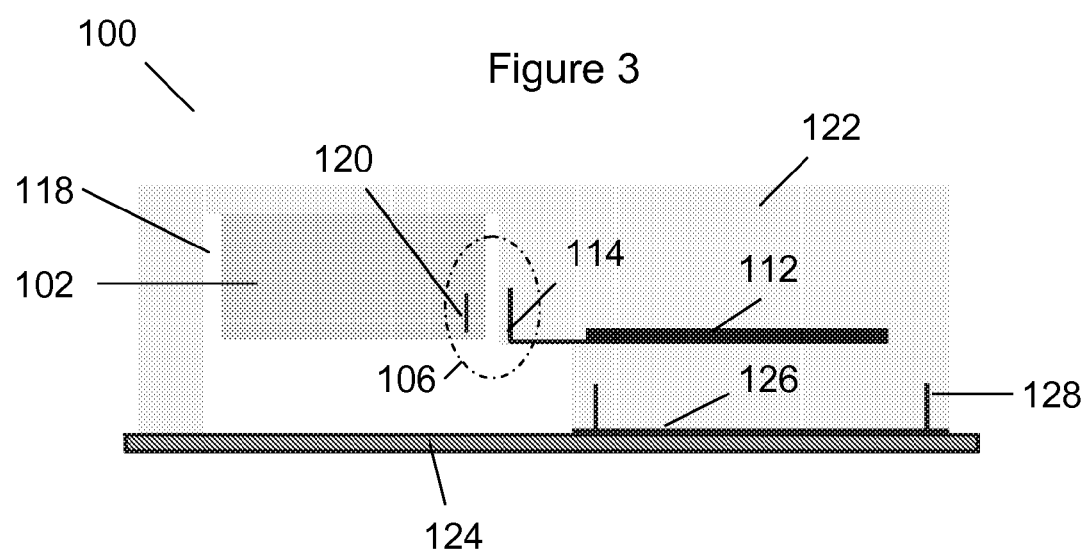
FIG. 3 shows a chip to package connection by a vertical capacitive coupling in an integrated circuit structure with the chip and the antenna-in-package on a single package substrate according to an embodiment of the present invention.

FIG. 3 shows a chip to package connection by a vertical capacitive coupling in an integrated circuit structure 100 with the chip and the antenna-in-package on a single package substrate 122 according to an embodiment of the present invention. FIG. 3 shows an integrated circuit structure 100 including a single package substrate 122. The package substrate 122 may include a package material for example low temperature co-fired ceramic, liquid crystal polymer, silicon, but not so limited.

An antenna 112 is disposed within the package substrate 122 and a feedline 114 extends from one end of the antenna 112 within the package substrate 122. The antenna 112 and the feedline 114 may include a conductive material, for example copper, silver or gold. The antenna 112 and the feedline 114 may also be of the same conductive material.

A socket 118 is formed in the package substrate 122 and is positioned adjacent or at a distance away from the feedline 114 and the antenna 112 in the package substrate 122. The socket 118 is configured to house a chip 102 but not so limited.

The chip 102 includes a chip connection 120 formed on a surface of the chip 102. The chip connection 120 may be formed of a conductive material, similar to that of the feedline 114 or the antenna 112 but not so limited. The chip connection 120 is arranged substantially parallel to the feedline 114 and the chip connection 120 and the feedline 114 are positioned substantially perpendicular to a horizontal plane of the package substrate 122. The chip connection 120 forms a capacitor 106 with the feedline 114 on the package substrate 122.

The integrated circuit structure 100 further includes a printed circuit board 124 positioned or formed below the package substrate 122. The printed circuit board 124 extends along the length of the antenna 112 and the chip 102 and may serve as a support for the package substrate 122. A conducting plane 126 is formed between at least a portion of the package substrate 122 and at least a corresponding portion of the printed circuit board 124. The conducting plane 126 is positioned below the antenna 112 and the planar area occupied by the conducting plane 126 is at least comparable or larger than the planar area occupied by the antenna 112. The conducting plane 126 serves as a ground plane. Two vias 128 serving as a fence extend vertically from a horizontal plane of the ground plane 126, the location of each via 128 corresponding to an end portion of the antenna 112. The combination of the ground plane 126 and the vias 128 form a quasi cavity which serves to improve the antenna performance and to reduce the potential electromagnetic interference from the antenna 112 radiation to the chip 102.

Figure 4:
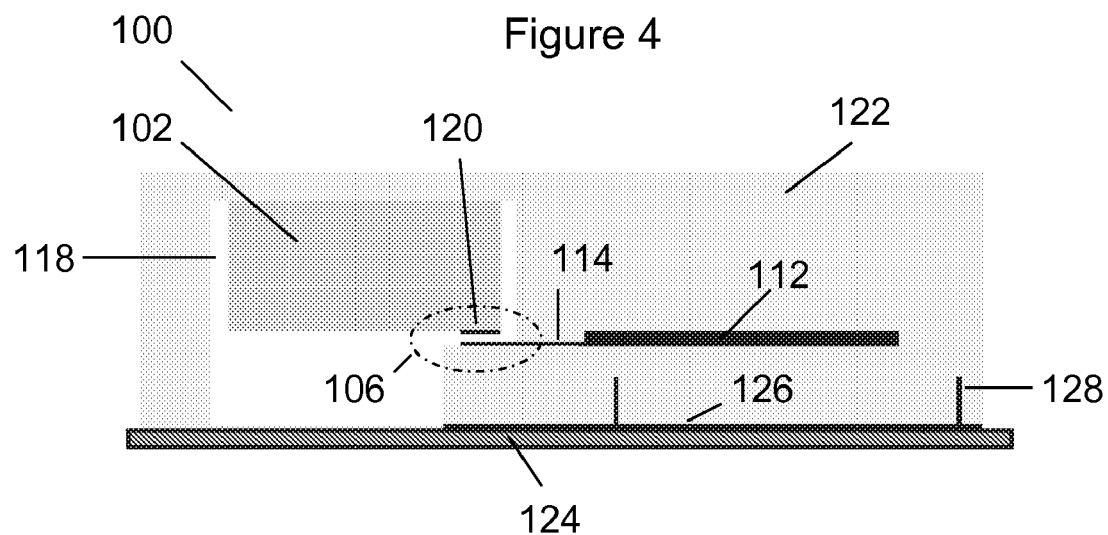
FIG. 4 shows a chip to package connection by a horizontal capacitive coupling in an integrated circuit structure with the chip and the antenna-in-package on a single package substrate according to an embodiment of the present invention.

FIG. 4 shows a chip to package connection by a horizontal capacitive coupling in an integrated circuit structure 100 with the chip and the antenna-in-package on a single package substrate 122 according to an embodiment of the present invention. FIG. 4 shows an integrated circuit structure 100 including a single package substrate 122. The package substrate 122 may include a package material for example low temperature co-fired ceramic, liquid crystal polymer, silicon, but not so limited.

An antenna 112 is disposed within the package substrate 122 and a feedline 114 extends from one end of the antenna 112 within the package substrate 122. The antenna 112 and the feedline 114 may include a conductive material, for example copper, silver or gold. The antenna 112 and the feedline 114 may also be of the same conductive material.

A socket 118 is formed in the package substrate 122 and is positioned adjacent or at a distance away from the feedline 114 and the antenna 112 in the package substrate 122. The socket 118 is configured to house a chip 102 but not so limited.

The chip 102 includes a chip connection 120 formed on a surface of the chip 102. The chip connection 120 may be formed of a conductive material, similar to that of the feedline 114 or the antenna 112 but not so limited. The chip connection 120 is arranged substantially parallel to the feedline 114 and the chip connection 120 and the feedline 114 are positioned substantially parallel to a horizontal plane of the package substrate 122. The chip connection 120 forms a capacitor 106 with the feedline 114 on the package substrate 122.

The integrated circuit structure 100 further includes a printed circuit board 124 positioned or formed below the package substrate 122. The printed circuit board 124 extends along the length of the antenna 112 and the chip 102 and may serve as a support for the package substrate 122. A conducting plane 126 is formed between at least a portion of the package substrate 122 and at least a corresponding portion of the printed circuit board 124. The conducting plane 126 is positioned below the antenna 112 and chip connection 120 on the chip 102 and the planar area occupied by the conducting plane 126 is at least comparable or larger than the planar area occupied by the antenna 112 and the chip connection 120. The conducting plane 126 serves as a ground plane. Two vias 128 serving as a fence extend vertically from a horizontal plane of the ground plane 126, the location of each via 128 corresponding to an end portion of the antenna 112. The combination of the ground plane 126 and the vias 128 form a quasi cavity which serves to improve the antenna 112 performance and to reduce the potential electromagnetic interference from the antenna 112 radiation to the chip 102. The ground plane 126 in FIG. 4 is positioned below the antenna 112 and the chip connection 120, and is larger when compared to the ground plane 126 in FIG. 3 which is positioned only below the antenna 112. For coplanar waveguide (CPW) lines, two types of construction may be possible, one construction has ground below the chip connection 120 as shown in FIG. 4 and the other has no ground below the chip connection 120 as shown in FIG. 3.

Figure 5:
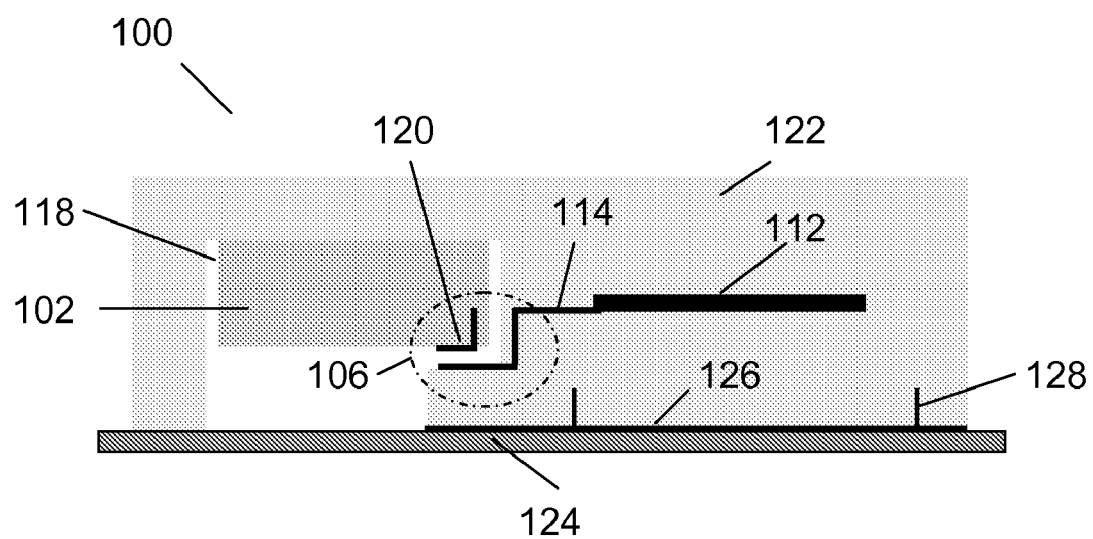
FIG. 5 shows a chip to package connection by a combination of a vertical and a horizontal capacitive coupling in an integrated circuit structure with the chip and the antenna-in-package in a single package substrate according to an embodiment of the present invention.

FIG. 5 shows a chip to package connection by a combination of a vertical and a horizontal capacitive coupling in an integrated circuit structure with the chip and the antenna-in-package in a single package substrate according to an embodiment of the present invention. FIG. 5 shows an integrated circuit structure 100 including a single package substrate 122. The package substrate 122 may include a package material for example low temperature co-fired ceramic, liquid crystal polymer, silicon, but not so limited.

An antenna 112 is disposed within the package substrate 122 and a feedline 114 extends from one end of the antenna 112 within the package substrate 122. The antenna 112 and the feedline 114 may include a conductive material, for example copper, silver or gold. The antenna 112 and the feedline 114 may also be of the same conductive material.

A socket 118 is formed in the package substrate 122 and is positioned adjacent or at a distance away from the feedline 114 and the antenna 112 in the package substrate 122. The socket 118 is configured to house a chip 102 but not so limited.

The chip 102 includes a chip connection 120 formed on a surface of the chip 102. The chip connection 120 may be formed of a conductive material, similar to that of the feedline 114 or the antenna 112 but not so limited. The chip connection 120 is arranged substantially parallel to the feedline 114. A portion of the chip connection 120 and a portion of the feedline 114 are positioned substantially parallel to a horizontal plane of the package substrate 122 while another portion of the chip connection 120 and another portion of the feedline 114 are positioned substantially perpendicular to the horizontal plane of the package substrate 122. The respective portions of the chip connection 120 form respective capacitors 106 with the respective corresponding portions of the feedline 114 on the package substrate 122. This arrangement is a combination of the arrangements in FIG. 3 and FIG. 4. With a similar coupling distance, a larger capacitance value is expected for this arrangement and this may consequently enhance the coupling performance.

The integrated circuit structure 100 further includes a printed circuit board 124 positioned or formed below the package substrate 122. The printed circuit board 124 extends along the length of the antenna 112 and the chip 102 and may serve as a support for the package substrate 122. A conducting plane 126 is formed between at least a portion of the package substrate 122 and at least a corresponding portion of the printed circuit board 124. The conducting plane 126 is positioned below the antenna 112 and chip connection 120 on the chip 102 and the planar area occupied by the conducting plane 126 is at least comparable or larger than the planar area occupied by the antenna 112 and the chip connection 120. The conducting plane 126 serves as a ground plane. Two vias 128, serving as a fence, extend vertically from a horizontal plane of the ground plane 126, the location of each via 128 corresponding to an end portion of the antenna 112. The combination of the ground plane 126 and the vias 128 form a quasi cavity which serves to improve the antenna 112 performance and to reduce the potential electromagnetic interference from the antenna 112 radiation to the chip 102.

FIG. 6 shows a chip to chip connection by a capacitive coupling in an integrated circuit structure according to an embodiment of the present invention. FIG. 6 shows an integrated circuit structure 100 including two chips 134, 136 arranged on a package substrate 138. The chips 134, 136 may also be arranged within the package substrate 138. The package substrate 138 may include a package material for example low temperature co-fired ceramic (LTCC), Flame Retardant 4 (FR4), liquid crystal polymer, silicon, but not so limited. The package substrate 138 is the same as that for FIGS. 2 to 5.

Each of the chips 134, 136 includes a respective chip connection 130, 132 formed on a surface of the chips 134, 136. The chip connections 130, 132 may be formed of a conductive material. A first chip connection 130 on a first chip 134 is arranged substantially parallel to a second chip connection 132 on a second chip 136 and the first chip connection 130 forms a capacitor 106 with the second chip connection 132. Both the first chip connection 130 and the second chip connection 132 are positioned substantially perpendicular to a horizontal plane of the package substrate 138.

FIG. 7 shows a combination of a chip to package connection and a chip to chip connection by respective capacitive coupling in an integrated circuit structure according to an embodiment of the present invention. FIG. 7 shows an integrated circuit structure 100 including a single package substrate 122. The package substrate 122 may include a package material for example low temperature co-fired ceramic, liquid crystal polymer, silicon, but not so limited.

An antenna 112 is disposed within the package substrate 122 and a feedline 114 extends from one end of the antenna 112 within the package substrate 122. The antenna 112 and the feedline 114 may include a conductive material, for example copper, silver or gold. The antenna 112 and the feedline 114 may also be of the same conductive material.

A socket 118 is formed in the package substrate 122 and is positioned adjacent or at a distance away from the feedline 114 and the antenna 112 in the package substrate 122. The socket 118 is configured to house two chips 134, 136 but not so limited.

Each of the chips 134, 136 includes a respective chip connection 130, 132 formed on a surface of the chips 134, 136. The chip connections 134, 136 may be formed of a conductive material. A first chip connection 130 on a first chip 134 is arranged substantially parallel to a second chip connection 132 on a second chip 136 and the first chip connection 130 forms a capacitor 106 with the second chip connection 132. Both the first chip connection 130 and the second chip connection 132 are positioned substantially perpendicular to a horizontal plane of the package substrate 122.

The second chip 136 includes a third chip connection 140, the third chip connection 140 includes two portions, and each portion is arranged substantially parallel to the feedline 114. A portion of the third chip connection 140 and a portion of the feedline 114 are positioned substantially parallel to a horizontal plane of the package substrate 122 while another portion of the third chip connection 140 and another portion of the feedline 114 are positioned substantially perpendicular to the horizontal plane of the package substrate 122. The respective portions of the third chip connection 140 forms respective capacitors 106 with the respective corresponding portions of the feedline 114 on the package substrate 122. This arrangement is a combination of the arrangements in FIG. 5 and FIG. 6.

The integrated circuit structure 100 further includes a printed circuit board 124 positioned or formed below the package substrate 122. The printed circuit board 124 extends along the length of the antenna 112 and the chips 134, 136 and may serve as a support for the package substrate 122. A conducting plane 126 is formed between at least a portion of the package substrate 122 and at least a corresponding portion of the printed circuit board 124. The conducting plane 126 is positioned below the antenna 112 and a portion of the third chip connection 140 on the second chip 136 and the planar area occupied by the conducting plane 126 is at least comparable or larger than the planar area occupied by the antenna 112 and the portion of the third chip connection 140. The conducting plane 126 serves as a ground plane. Two vias 128, serving as a fence extend vertically from a horizontal plane of the ground plane 126, the location of each via 128 corresponding to an end portion of the antenna 112. The combination of the ground plane 126 and the vias 128 form a quasi cavity which serves to improve the antenna 112 performance and to reduce the potential electromagnetic interference from the antenna 112 radiation to the chip 102.

Figure 8:
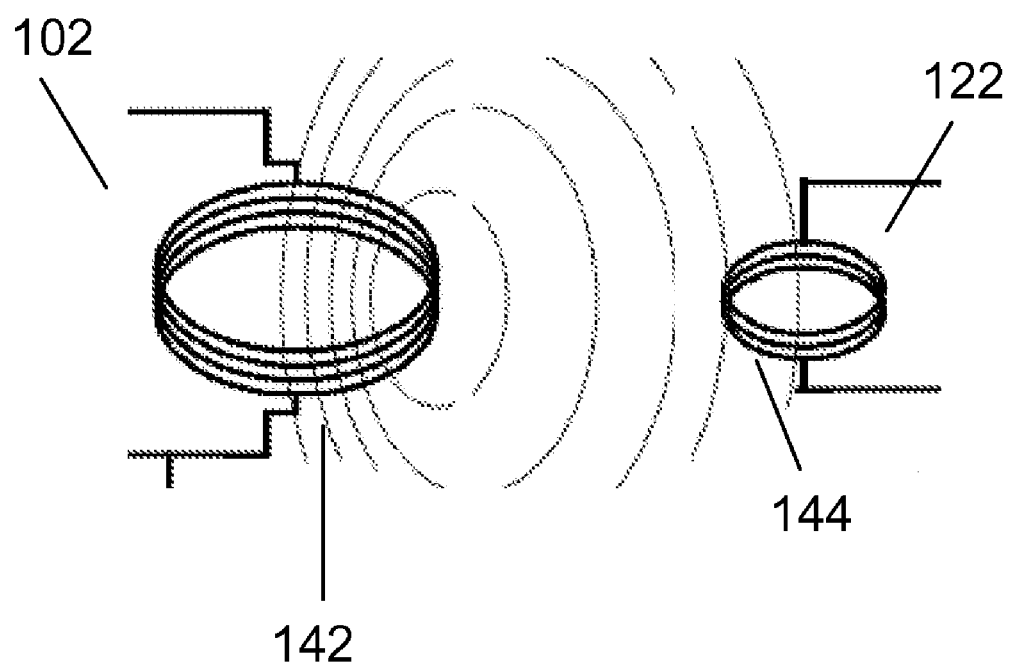
FIG. 8 shows a chip to package connection by an inductive coupling in an integrated circuit structure according to an embodiment of the present invention.

FIG. 8 shows a chip to package connection by an inductive coupling in an integrated circuit structure according to an embodiment of the present invention. FIG. 8 shows a first inductor 142 positioned on a portion of a chip 102 and a second inductor 144 positioned on a portion of a package substrate 122. The first inductor 142 on the portion of the chip 102 is coupled to the second inductor 144 on the portion of the package substrate 122 by inductive coupling.

Figure 9A:
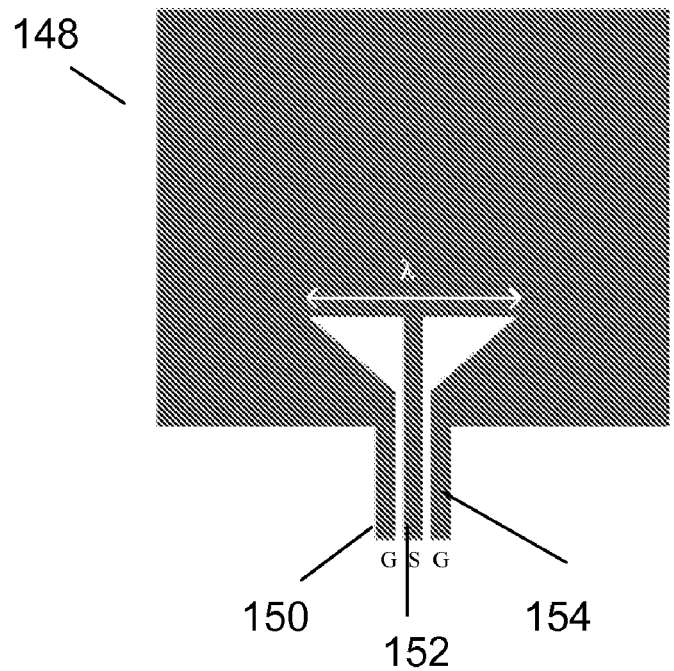
FIG. 9A shows a layout of an inductive feeding slot radiating element in an integrated circuit structure according to an embodiment of the present invention.
Figure 9B:
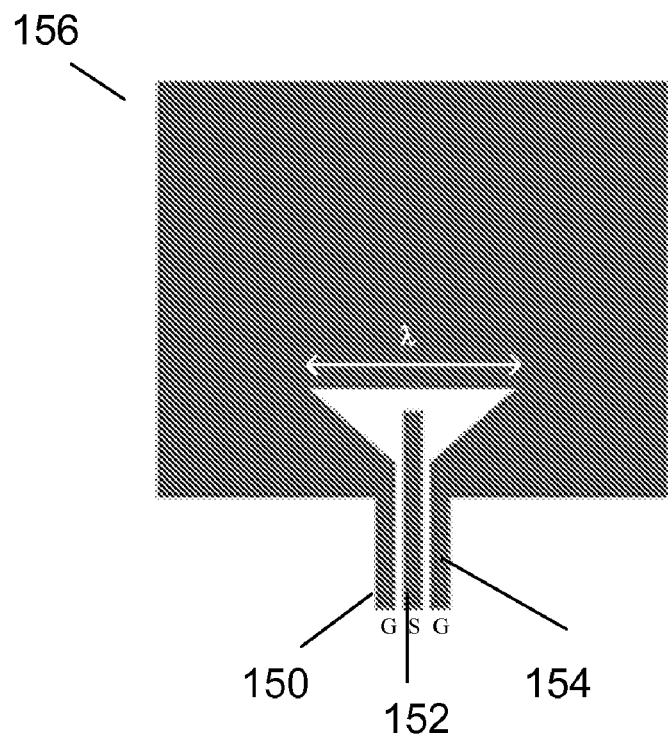
FIG. 9B shows a layout of a capacitive coupling slot radiating element in an integrated circuit structure according to an embodiment of the present invention.

To overcome fracture and warpage problem caused by conventional microstrip patch radiating-element in antenna-in-package design, a coplanar waveguide (CPW)-fed wideband triangle (WB-triangle) slot radiating element as shown in FIG. 9A and FIG. 9B may be used.

FIG. 9A shows a layout of an inductive feeding slot radiating element 148 in an integrated circuit structure according to an embodiment of the present invention. The inductive slot radiating element 148 may include three feedlines, namely ground (G) 150, signal (S) 152, and ground (G) 154. In FIG. 9A, the signal line 152 is connected to the base of the triangular slot. The base is also the ground. Hence, it is inductive feeding type.

FIG. 9B shows a layout of a capacitive coupling slot radiating element in an integrated circuit structure according to an embodiment of the present invention. The capacitive slot radiating element 156 may include three feedlines, namely ground (G) 150, signal (S) 152, and ground (G) 154. In FIG. 9B, the signal line 152 is not connected to the base (ground) of the triangular slot. It is capacitive feeding type. The beveled structure may be used for wideband impedance matching capability. A lot radiating element is created with length (L)=λ. The relative bandwidth of over approximately 10% may be achieved for the layout in FIG. 9A and FIG. 9B.

The size of millimeter wave (mmWave) antenna-in-package (AiP) may be on the order of millimeters or less. In addition, antenna-in-package may be miniaturized further for integration purpose. This makes it challenging for the antenna-in-package to achieve a high gain owing to a decreased antenna size. To try to overcome this problem, a director as shown in FIG. 10A and FIG. 10B may be used to improve the gain of mmWave AiP.

Figure 10A:
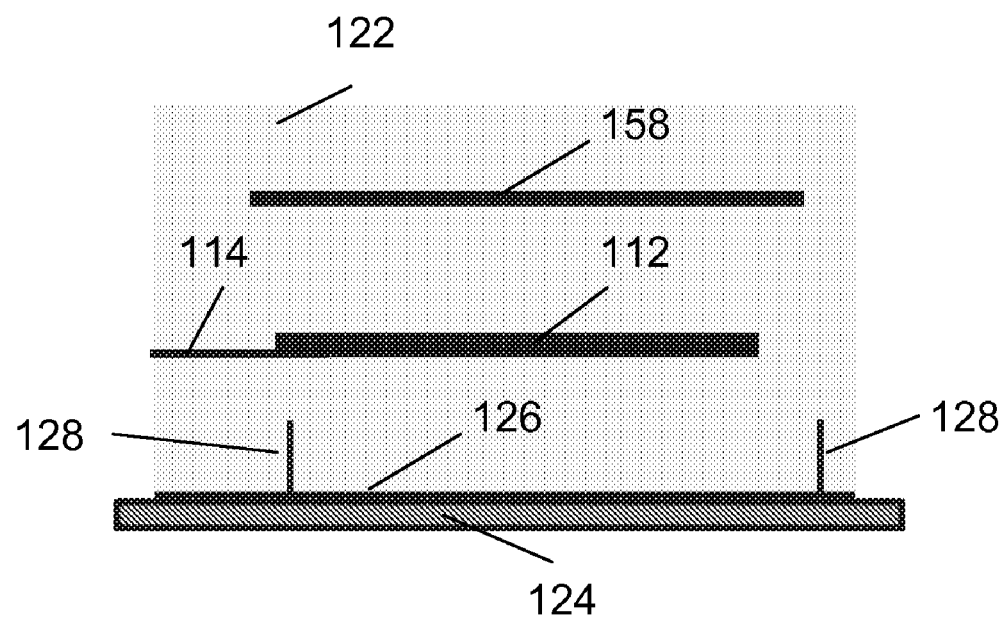
FIG. 10A shows a cross-sectional view of a director in an integrated circuit structure according to an embodiment of the present invention.
Figure 10B:
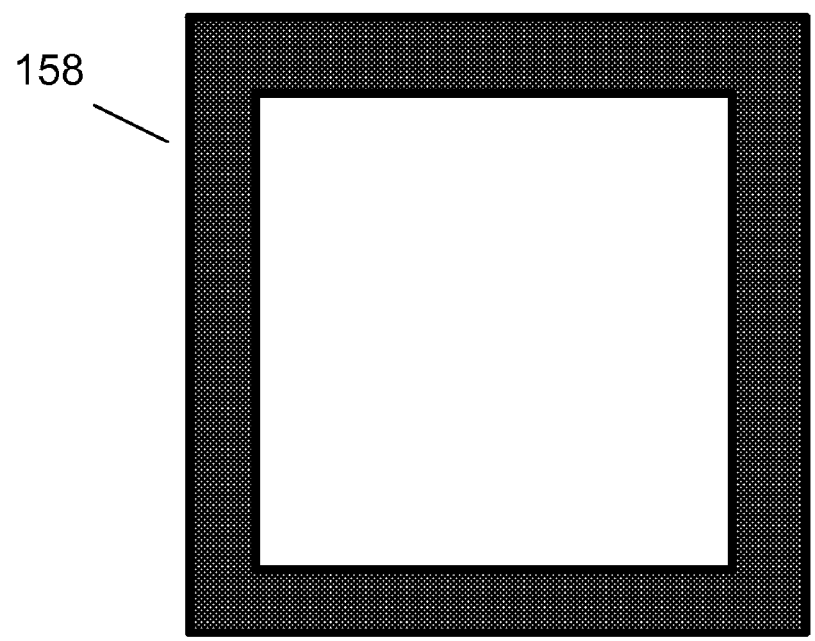
FIG. 10B shows a layout of a director in an integrated circuit structure according to an embodiment of the present invention.

FIG. 10A shows a cross-sectional view of a director in an integrated circuit structure according to an embodiment of the present invention. FIG. 10A shows a portion of an integrated circuit structure 100 including a single package substrate 122. The package substrate 122 may include a package material for example low temperature co-fired ceramic, liquid crystal polymer, silicon, but not so limited. An antenna 112 is disposed within the package substrate 122. The integrated circuit structure 100 further includes a printed circuit board 124 positioned or formed below the package substrate 122. The printed circuit board 124 extends along the length of the antenna 112 and may serve as a support for the package substrate 122. A conducting plane 126 is formed between at least a portion of the package substrate 122 and at least a corresponding portion of the printed circuit board 124. The conducting plane 126 is positioned below the antenna 112 and the planar area occupied by the conducting plane 126 is at least comparable or larger than the planar area occupied by the antenna 112. The conducting plane 126 serves as a ground plane. Two vias 128 serving as a fence extend vertically from a horizontal plane of the ground plane 126, each via 128 corresponding to an end portion of the antenna 112. The combination of the ground plane 126 and the vias 128 form a quasi cavity which serves to improve the antenna 112 performance and to reduce the potential electromagnetic interference from the antenna 112 radiation to the chip 102. The director 158 is realized in a metal plane format in the antenna radiating direction, above the antenna 112 and within the package substrate 122.

The director 158 can be close-looped or open-looped. FIG. 10B shows a layout of a director 158 in an integrated circuit structure 100 according to an embodiment of the present invention. FIG. 10B shows a director 158 having a close-looped rectangular layout. With proper design of the director, surface waves can be effectively suppressed and radiation efficiency can be improved, which makes the antenna gain improved greatly. The surface wave propagates on a horizontal surface of the package substrate 122. As the director 158 may be made of metal such as silver or gold, the director 158 may reflect or block the propagation of the surface wave, thereby improve radiation efficiency. For example, for a 60 GHz AiP 2dBi gain improvement may be obtained using the director layout as shown in FIG. 10B. Different shapes may also be realized for the director 158. The director 158 may be of a circular shape or a meander shape.

Figure 11:
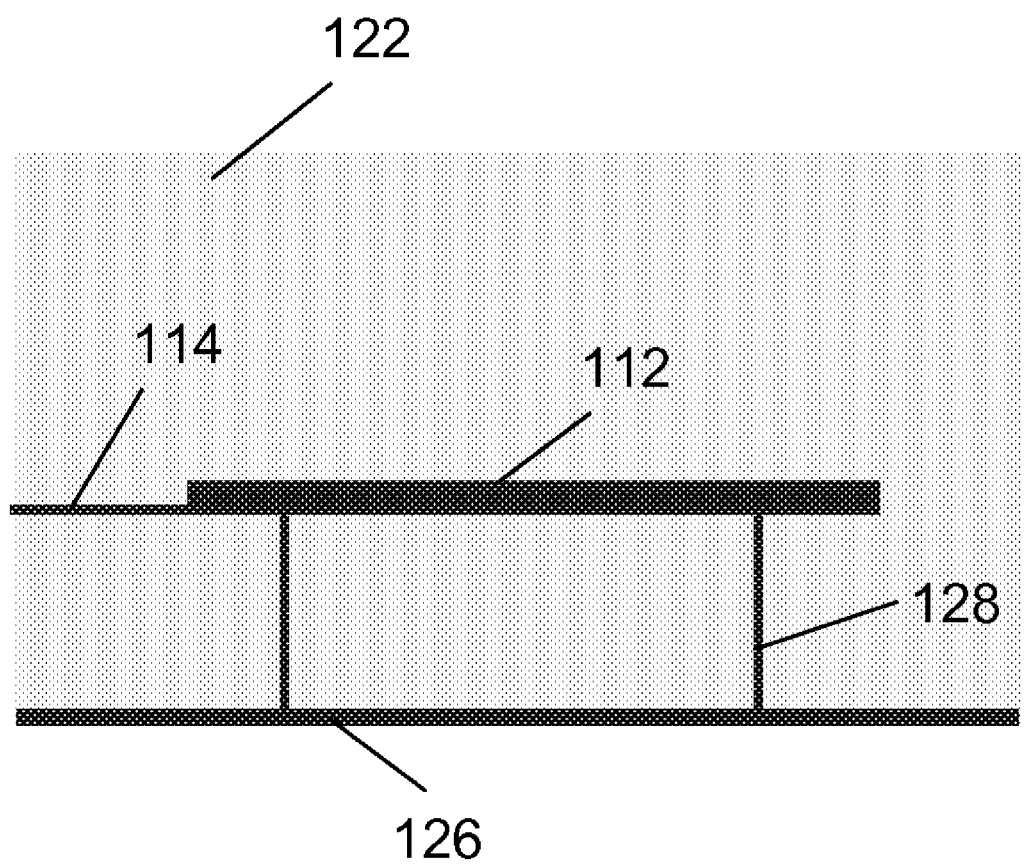
FIG. 11 shows a ground reflector in an integrated circuit structure according to an embodiment of the present invention.

To improve the gain of the mmWave AiP, a ground reflector 126 as shown in FIG. 11 may be used. A ground plane made of metal, which has a reflection coefficient near to 1, can be used as a reflector. The ground reflector 126 reflects the radiation towards the broadside direction so to increase the gain. FIG. 11 shows a ground reflector 126 in an integrated circuit structure 100 according to an embodiment of the present invention. FIG. 11 shows an integrated circuit structure 100 including a single package substrate 122. A slot antenna 112 is disposed within the package substrate 122 and a feedline 114 extends from the slot antenna 112 within the package substrate 122. Besides the slot antenna 112 as shown, all printed type of antennas can also be used. Other examples are microstrip patch antennas or monopole or dipole. A ground plane 126 may be fabricated below the slot antenna 112 within a package substrate 122. The ground plane 126 may function as a reflector. As an example in FIG. 11, the vias 128 can go all the way up from the ground reflector 126 to the slot antenna 112. The height of the vias 128 may be properly adjusted according to the requirements. The ground plane 126 or ground reflector together with the fence of vias 128 forms a quasi metal cavity that helps to reduce the undesirable effect of antenna radiation to the nearby circuits and the unwanted effect of the circuits to the antenna.

Figure 12:
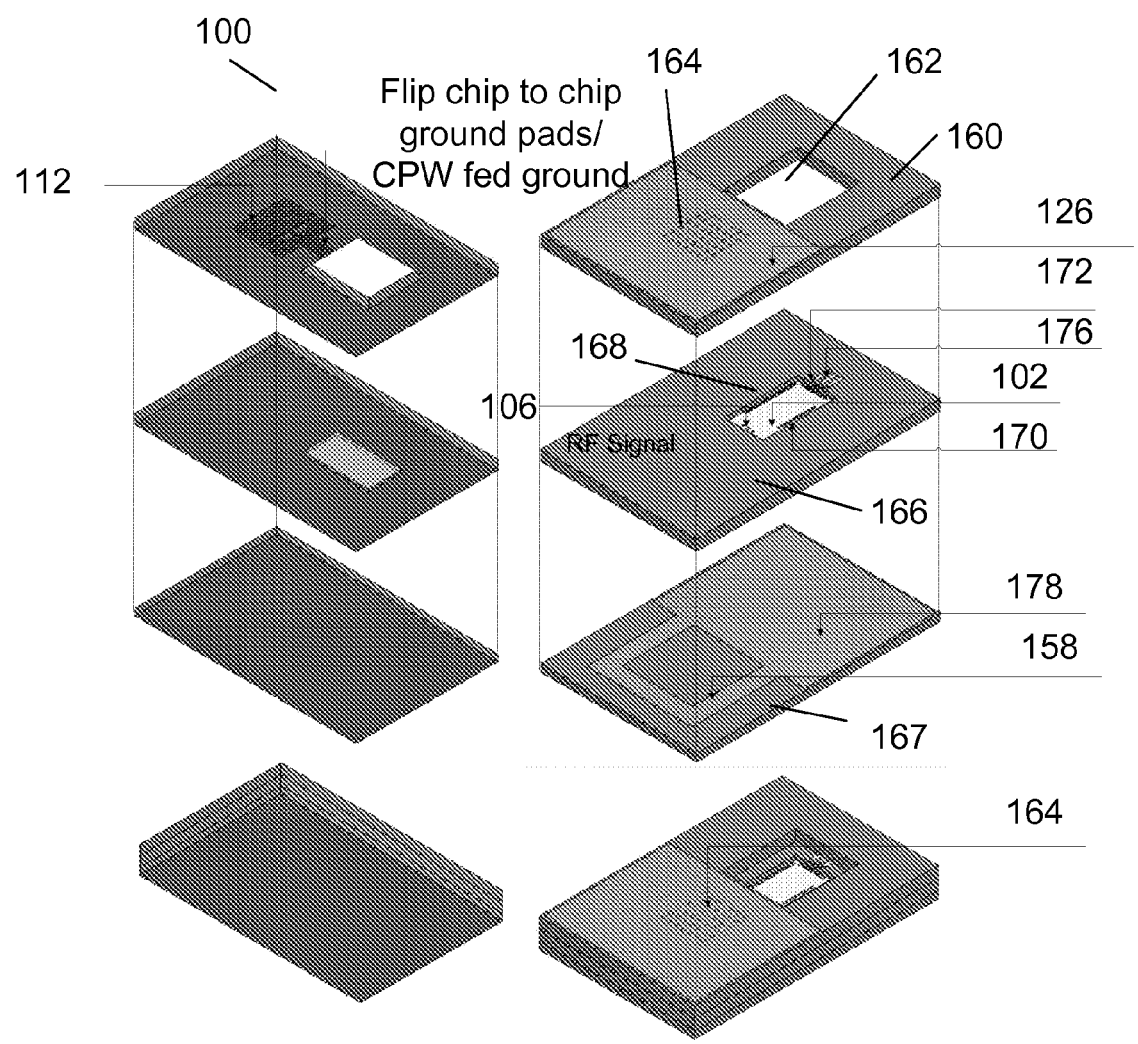
FIG. 12 shows an exploded three-dimensional view of an integrated circuit structure in a ball grid array package according to an embodiment of the present invention.

FIG. 12 shows an exploded three-dimensional view of an integrated circuit structure in a ball grid array package according to an embodiment of the present invention. The integrated circuit structure 100 integrates a slot radiating element or slot antenna 112, an alternating current (capacitive) coupling feeding 106, a ring director 158 and a ground reflector 126. Three dielectric layers 160, 166, 167 may be used to form a package substrate 122.

The first dielectric layer 160 includes a large cavity 162. In addition, a ground reflector 126 is positioned on one surface of the first dielectric layer 160 and a coplanar (CPW)-fed antenna 112 is positioned on the other surface of the first dielectric layer 160. The first dielectric layer 160 also includes a plurality of via holes 164 formed inside and outside corresponding to the area occupied by the ground reflector 126 and the CPW-fed antenna 112, allowing a plurality of vias 128 to go all the way from a slot antenna ground 112 to the ground reflector 126. The ground reflector 126 may also be connected to a PCB ground (not shown). The ground reflector 126 may contribute to the shielding of the antenna 112 from the outside circuit. Actually, the CPW-fed antenna 112 includes the slot antenna ground 112. It is seen from the FIG. 9A and FIG. 9B that the slot antenna ground 112 is the conducting plane connected with ground feedlines, namely ground (G) 150 and ground (G) 154. That is, for inductive slot radiating element 148, all the conducting plane of the antenna is the ground. While for capacitive slot radiating element 156, all the conducting plane of antenna is the ground except signal feedline 152. The slot antenna uses the slot formed by the conducting planes to radiate. This is the basic mechanism of the slot antenna.

The second dielectric layer 166 includes a smaller cavity 168. The large cavity 162 in the first layer 160 and the smaller cavity 168 in the second layer 166 form a package cavity configured to load a chip 102. Signal feeding from the chip 102 to the slot antenna 112 may be realized by capacitive coupling 106. While the chip ground pad is connected to the slot antenna ground line using flip chip technology, the other chip pads are connected to the signal traces 176 in the second dielectric layer 166 using bond wires 172 or flip chip technology 174. There is a plurality of on-chip pads 170 within the smaller cavity 168.

The third dielectric layer 167 includes a ring director 158 and a chip ground 178. The ring director 158 and the chip ground 178 may be formed together using a same metal plane or different metal plates. The chip 102 may be adhered to the chip ground 178. The configuration may contribute to the shielding of the chip 102 from the antenna 112. In this regard, the integrated circuit structure 100 may provide a compact and optimized solution for communication systems operating at mmWave frequencies.

Figure 13:
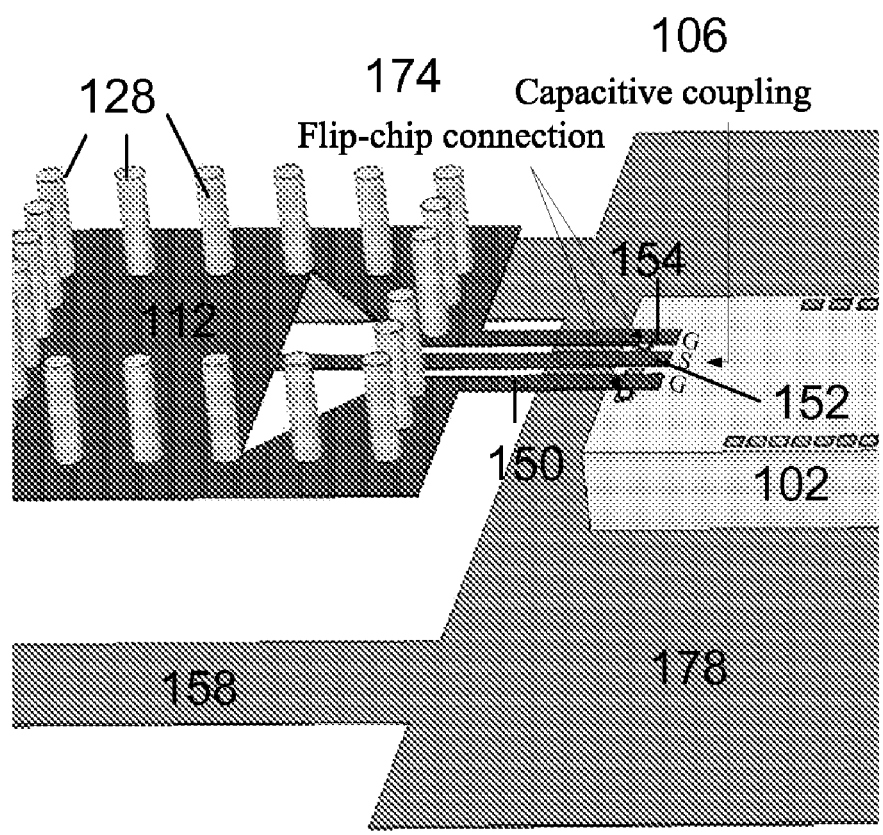
FIG. 13 shows a zoom in view of a chip to package connection by a capacitive coupling in an integrated circuit structure according to an embodiment of the present invention.

FIG. 13 shows a zoom in view of a chip to package connection by a capacitive coupling in an integrated circuit structure according to an embodiment of the present invention. The integrated circuit structure 100 includes a chip ground 178 and a director 158 on one plane. A chip 102 is positioned above the chip ground plane 178. One of the chip connections on a surface of the chip 102 forms a capacitor 106 with the signal feedline 152 extending from an antenna 112. The other two chip connections on the surface of the chip 102 are connected to the respective ground feedlines 150, 154 extending from the antenna 112 by flip chip technology 174. Vias 128 extend from the surface of the antenna 112 for connection to a ground reflector 126.

FIG. 14 shows a fabrication process of an integrated circuit structure according to an embodiment of the present invention. First in step 180, a pre-processing step is carried out on four package substrates 146. This pre-processing step includes blanking drying the package substrates 146. Then in step 182, the respective vias and cavities are formed in each of the four package substrates 146. In 184, the vias are filled with a conductive material. This is followed by respective conductor-printing in step 186 to form a respective ground reflector, a slot antenna, signal traces and a chip ground and a ring director. In step 188, the respective package substrates are inspected to check for non-uniformity. After inspection, the first and second package substrate are collated in step 190, and laminated, co-fired, then diced in step 192. The finished top package element has the ground reflector on the top and new CPW-fed slot antenna at the bottom. In the same manner, after inspection, the third and fourth layers are collated in step 190, and laminated, co-fired, then diced in step 192. In step 194, the chip is loaded in a cavity formed in the finished bottom package element. The chip is adhered to the chip ground which also features a ring director. After the chip is loaded to the bottom package element, the top and bottom package elements are then bonded together by flip-chip bonding and package bonding processes in step 196, where the flip-chip bonding is used for the interconnection of chip ground pads to the ground of the antenna CPW feeding. During this process capacitive coupling is automatically formed for RF signal feeding. The following in step 198 is the wire bonding of other non-RF pads to the package signal traces. The final finished product is an AiP to be sent for characterization in step 200. If LCP technology is used, the top and bottom package element bonding can be replaced by the co-firing process while other processes remain almost same.

The aforementioned description of the various embodiments has been presented for purposes of illustration and description. It is not intended to be exhaustive or to limit the invention to the precise form disclosed, and obviously many modifications and variations are possible in light of the disclosed teaching. It is intended that the scope of the invention be defined by the claims appended hereto.

What is claimed is:

1. An integrated circuit structure comprising:
   a first package substrate comprising a radiating element, the radiating element having a radiating element connection extending from the radiating element;
   a first chip positioned adjacent to the radiating element connection, the first chip having a first chip connection on a surface of the first chip; and
   wherein a first portion of the first chip connection and a first portion of the radiating element connection are positioned substantially perpendicular to a horizontal plane of the first package substrate, and a second portion of the first chip connection and a second portion of the radiating element connection are positioned substantially parallel to the horizontal plane of the first package substrate;
   wherein the first chip connection forms a capacitive coupling with the radiating element connection.

2. The integrated circuit structure of claim 1,
   wherein the first chip is positioned on or housed within the first package substrate,
   wherein the first package substrate comprises a socket for housing the first chip.

3. The integrated circuit structure of claim 2, wherein the first package substrate comprises a cavity positioned below the radiating element for shielding magnetic field from the first chip.

4. The integrated circuit structure of claim 3, further comprising a second package substrate positioned below the first package substrate,
   wherein the second package substrate comprises a package frame or a printed circuit board.

5. The integrated circuit structure of claim 4, further comprising a ground plane positioned between at least a portion of the first package substrate and at least a portion of the second package substrate,
   wherein the ground plane is positioned below the radiating element and the first chip such that the ground plane overlaps at least an area covered by the radiating element and a portion of the first chip.

6. The integrated circuit structure of claim 5, wherein the cavity is formed by at least two vias in the first package substrate and a portion of the ground plane.

7. The integrated circuit structure of claim 1, wherein the first portion of the first chip connection is positioned substantially parallel to the first portion of the radiating element connection, and the second portion of the first chip connection is positioned substantially parallel to the second portion of the radiating element connection.

8. The integrated circuit structure of claim 7, wherein the first chip connection is positioned at a distance away from the radiating element connection.

9. The integrated circuit structure of claim 2, further comprising a second chip positioned on or housed within the first package substrate,
wherein the second chip is positioned adjacent to the first chip.

10. The integrated circuit structure of claim 9,
wherein the second chip having a second chip connection on a surface of the second chip,
wherein the first chip connection forms a capacitive coupling with the second chip connection.

11. The integrated circuit structure of claim 1,
wherein the first chip is positioned or housed within a third package substrate,
wherein the third package substrate comprises a socket for housing the first chip.

12. The integrated circuit structure of claim 11, wherein the third package substrate comprises a cavity positioned over the radiating element for shielding magnetic field from the first chip.

13. The integrated circuit structure of claim 1,
wherein the first package substrate is formed from a packaging material,
wherein the packaging material being selected from a group of packaging materials consisting of low temperature co-fired ceramic, liquid crystal polymer, and silicon.

14. The integrated circuit structure of claim 11,
wherein the third package substrate is formed from a packaging material,
wherein the packaging material being selected from a group of packaging materials consisting of low temperature co-fired ceramic, liquid crystal polymer, and silicon.

15. The integrated circuit structure of claim 1,
wherein the first chip is an integrated circuit, and/or
wherein the radiating element is an antenna.

16. The integrated circuit structure of claim 9, wherein the second chip is an integrated circuit.

17. The integrated circuit structure of claim 1,
wherein the first chip connection comprises a conductive material, and/or
wherein the radiating element connection comprises a conductive material,
the conductive material being selected from a group of conductive materials consisting of copper, silver and gold.

18. The integrated circuit structure of claim 10,
wherein the second chip connection comprises a conductive material,
the conductive material being selected from a group of conductive materials consisting of copper, silver and gold.

19. The integrated circuit structure of claim 1, wherein the first chip is distanced from the radiating element.

20. A method of forming an integrated circuit structure, the method comprising:
forming a radiating element on a first package substrate, the radiating element having a radiating element connection extending from the radiating element;
positioning a first chip adjacent to the radiating element connection, the first chip having a first chip connection on a surface of the first chip;
positioning the first chip connection and the radiating element connection, such that a first portion of the first chip connection and a first portion of the radiating element are substantially perpendicular to a horizontal plane of the first package substrate, and a second portion of the first chip connection and a second portion of the radiating element connection are substantially parallel to the horizontal plane of the first package substrate;
wherein the first chip connection forms a capacitive coupling with the radiating element connection.

* * * * *